US005766967A

United States Patent [19]
Lai et al.

[11] Patent Number: 5,766,967
[45] Date of Patent: Jun. 16, 1998

[54] METHOD FOR FABRICATING A SUBMICRON T-SHAPED GATE

[75] Inventors: Yeong-Lin Lai, Taipei Hsien; Hung-Ping D. Yang, Hsinchu Hsien; Chun-Yen Chang, Hsinchu; Edward Y. Chang, Hsinchu; Kazumitsu Nakamura, Hsinchu; Rico Chang, Taoyuan Hsien, all of Taiwan

[73] Assignee: Industrial Technology Research Institute, Hsinchu, Taiwan

[21] Appl. No.: 726,952

[22] Filed: Oct. 7, 1996

[30] Foreign Application Priority Data

Jun. 7, 1996 [TW] Taiwan .................. 85106842

[51] Int. Cl.⁶ .................. H01L 21/8232
[52] U.S. Cl. .................. 437/415 SH; 437/405 SH; 437/229; 437/912; 437/944
[58] Field of Search .................. 437/41 R, 41 RG, 437/41 SH, 40 SH, 229, 944, 203, 912; 430/312; 148/DIG. 100

[56] References Cited

U.S. PATENT DOCUMENTS

| | | |
|---|---|---|
| 4,532,002 | 7/1985 | White .................. 437/944 |
| 4,959,326 | 9/1990 | Roman et al. .................. 437/203 |
| 5,155,053 | 10/1992 | Atkinson .................. 437/203 |
| 5,185,277 | 2/1993 | Tung et al. .................. 437/229 |
| 5,240,878 | 8/1993 | Fitzsimmons et al. .................. 437/944 |
| 5,288,654 | 2/1994 | Kasai et al. .................. 437/912 |
| 5,432,125 | 7/1995 | Misawa et al. .................. 437/944 |
| 5,500,381 | 3/1996 | Yoshida et al. .................. 437/912 |

*Primary Examiner*—Michael Trinh
*Attorney, Agent, or Firm*—Ladas & Parry

[57] ABSTRACT

A method for fabricating submicron T-shaped gates for the field-effect transistors disclosed, which can be accomplished by using a tri-layer positive photoresist with a single electron beam exposure and a single development step. Therefore, the cost can be reduced and the yield can be raised for fabricating high speed field-effect transistors. The method comprises the steps of: (i) sequentially spinning coating a first photoresist layer, a second photoresist layer and a third photoresist layer on the top of epitaxial layers, wherein the second photoresist layer is thicker than the third photoresist layer, and the third photoresist layer is not thicker than the first photoresist layer, the viscosity of the second photoresist layer is larger than that of the first and third photoresist layers, and the electron beam sensitivity of the second photoresist layer is larger than that of the first and the third photoresist layers; (ii) exposing all the gate stripe region of the photoresist layers by a single electron beam exposure; (iii) using a developer to develop all the exposed positions of the three photoresist layers by a single development step, so that a T-shaped opening is formed; (iv) etching and removing a contact layer of the epitaxial layers under the T-shaped opening; (v) evaporating gate metal layers to cover the third photoresist layer and to fill the T-shaped opening; (vi) removing the photoresist layers to lift off the evaporated metal layers so that the submicron T-shaped gate is obtained.

18 Claims, 12 Drawing Sheets

METHOD FOR FABRICATING A SUBMICRON T-SHAPED GATE

BACKGROUND OF THE INVENTION

1. Field of the invention

The present invention is a method for fabricating T-shaped gate of field-effect transistors, which can be accomplished by using a tri-layer photoresist with a single e-beam exposure and a single development step.

2. Description of prior arts

For the radio-frequency (RF) and microwave circuits, high-performance transistors are needed in order to provide the circuits with required gain and power. As the microwave communication technology developing forward, the communication frequencies tend to shift toward higher frequency bands. For devices and circuits made of conventional Si are suitable for applications below 2 GHz. For applications above 2 GHz, the devices have to be made of GaAs- or InP-based materials because GaAs, InP, and their related compounds have higher electron mobilities and higher electron velocities. Normally, the field-effect transistors (FETs) in the RF and microwave circuits should have their gate-lengths smaller than 1 µm. For example, the gate-length of a 10-GHz GaAs FET amplifier should be about 0.25 to 0.5 µm or smaller to in order to amplify the input signals effectively. The device gains and cutoff frequencies of a FET increase with decreasing gate-length, which is mainly due to a lower gate-source capacitance ($C_{gs}$) and a higher transconductance ($g_m$) for a small gate-length FET. In addition, submicron gate-length devices have better noise characteristics. However, when the gate-length of the PET is decreased below 0.5 µm, it is difficult to fabricate the device by using the conventional UV exposure system. One of the solutions is the use of electron beam lithography systems. As the gate-length of the FET is reduced, its cross sectional area is also reduced, and the gate resistance ($R_g$) is increased. The high gate resistance problem has smaller effects on the performance of the FET for its low-frequency and DC applications, but are detrimental to the FET for its high-frequency applications, especially for the device with its gate-length smaller than 0.5 µm. The major effects are the reduction in the high-frequency device gain, current gain cutoff frequency ($f_T$), and power gain cut-off frequency ($f_{max}$). To make a FET gate with a rectangular cross section, a single-layer photoresist (usually PMMA) can be used, and the electron beam lithography system is used for exposure. However, the cross sectional area of such gate is proportional to its gate-length. As a result, the gate resistance increases with decreasing gate-length.

To increase the cross sectional area of a FET gate so as to reduce the gate resistance and to improve the performance of the device, one commonly used method is to adopt a bi-layer photoresist structure which includes a low/high photoresist structure, PMMA/P(MMA-MAA), to form a mushroom gate. That is, the positive photoresist PMMA (poly methyl methacrylate) that has the low (electron beam) sensitivity and high resolution is combined with the P(MMA-MAA) photoresist (poly methyl methacrylate-methacrylic acid) that has high (electron beam) sensitivity to form a bi-layer photoresist. The bi-layer photoresist can form openings of different linewidths at the PMMA layer and the P(MMA-MAA) layer after electron beam exposures and development. Referring to FIGS. 1a to 1f, the fabrication process is illustrated, which includes the steps described as follows. As shown in FIG. 1a, the epitaxial layers 12 are grown on a GaAs or InP substrate 10, then the first photoresist layer 14 (i.e. PMMA) is spun on the epitaxial layers 12. Referring to FIG. 1b, a second photoresist layer 16 (i.e. P(MMA-MAA)) is spun on top of the first photoresist layer 14. Referring to FIG. 1c, the two photoresist layers are respectively exposed by the electron beam lithography system, since the sensitivities of the first photoresist layer 14 and the second photoresist layer 16 are different, the exposed areas 20 of the first photoresist layer 14 and the second photoresist layer 16 are formed with different linewidths. Referring to FIG. 1d, the two photoresist layers are developed by a developer, so that an opening is formed, which is consisted of different linewidths of openings formed at the first photoresist layer 14 and the second photoresist layer 16, respectively. Referring to FIG. 1e, the metal layers 18 are evaporated to cover thereon. Referring to FIG. 1f, the wafer is soaked in acetone to remove the remaining photoresist, so as to lift off a portion of the metal layers, and form the Schottky gate electrode with a mushroom shape. This approach requires two e-beam exposures. Therefore it is quite expensive and time-consuming. Further, the evaporated metal is difficult to lift off since the metal layers evaporated on the photoresist and the metal layers filled in the opening are connected together.

To solve these problems, P. C. Chao et al. announced the first submicron T-gate made by using a ti-layer photoresist with the e-beam lithography system for exposure in 1983 (IDEM digest-1983, pp. 613 to 616). This technique utilized two electron beam exposures for a tri-layer photoresist which includes PMMA/P(MMA-MAA)/PMMA. An electron beam with a larger linewidth and lower energy was first used to expose the second and the third photoresist layers to obtain a wider exposed region, followed by a second electron beam exposure with a smaller linewidth and higher energy to form a narrow exposed region at the bottom photoresist layer. Moreover, the development must be performed three times since the developers for the PMMA and the P(MMA-MAA) are different. Detailed steps of this method are illustrated in FIGS. 2a to 2h. Referring to FIG. 2a, an epitaxial layer 32 is grown on a GaAs or InP substrate 30. Then, the first photoresist layer 34 (i.e. PMMA), and a second photoresist layer 36 (i.e. P(MMA-MAA)) are sequentially spun thereon. Referring to FIG. 2b, a third photoresist layer 38 (i.e. PMMA) is then spun on top of the second photoresist layer 36. Referring to FIGS. 2c and 2d, two electron beam exposures with two different energies are used to form different linewidths of the exposed region 40 at the different layers of photoresist. Referring to FIGS. 2e and 2f, different developers are used to respectively develop the exposed portions of the three layers of photoresist. Referring to FIG. 2g, the metal layers 45 is evaporated thereon, since the linewidths of openings of the second photoresist layer and the third photoresist layer are different, an overhang is formed by the remaining third photoresist layer on top of the second photoresist layer which is used for breaking the metal layers 45. Therefore, the metal layers 45 evaporated on the photoresist layer does not connect with that was evaporated in the opening, and can be readily lifted off. This approach solves the problem of difficulty in lifting off the metal layers in the bi-layer photoresist system. However, there are still problems that the fabrication process is too complicated, expensive, and time-consuming, since it needs two e-beam exposures and three development processes.

SUMMARY OF THE INVENTION

Accordingly, the object of the present invention is to provide a method for fabricating a submicron T-gate of a field-effect transistor, which can be accomplished by using a tri-Layer photoresist with a single electron beam exposure and one single development step.

Based on the fabrication method of the present invention, a T-shaped opening can be formed at the photoresist layers by the fabrication process to facilitate the liftoff process of the evaporated metal layers. Therefore, the cost can be reduced and the yield can be raised.

BRIEF DESCRIPTION OF THE DRAWINGS

The Followings are the detailed description, given by way of examples, which are not intended to limit the invention solely to the embodiments described herein, will best be understood in conjunction with the drawings attached in which.

DETAILED DESCRIPTION OF THE PREFERRED EMBODIMENTS

Figure 1A:
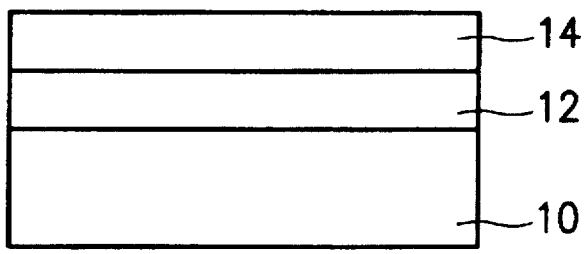
FIGS. 1a to 1f are the diagrams illustrating the fabrication process of a conventional mushroom gate.
Figure 1B:
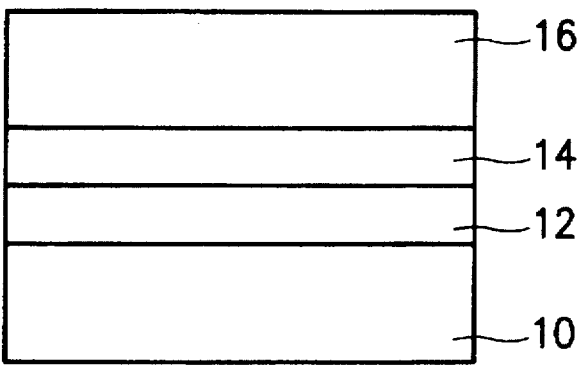
Figure 1C:
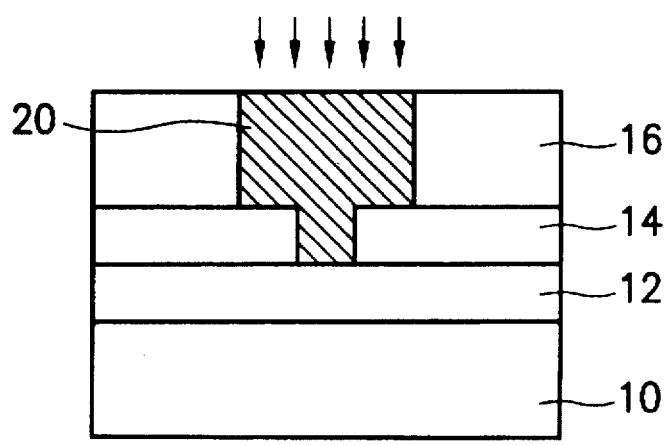
Figure 1D:
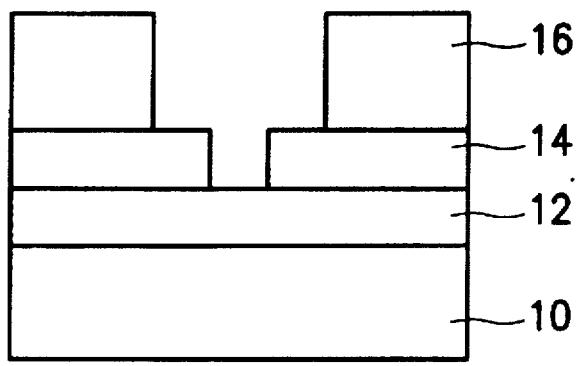
Figure 1E:
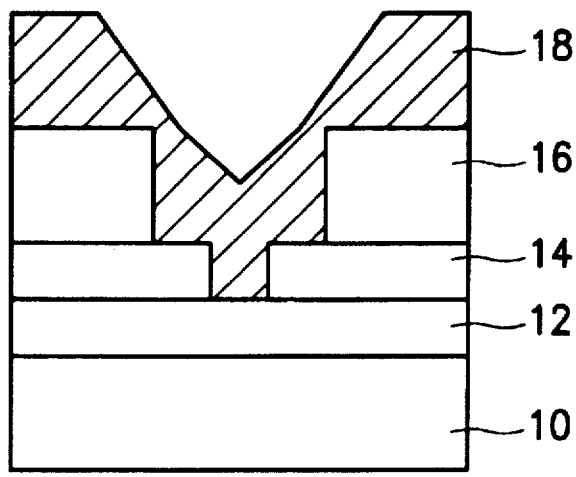
Figure 1F:
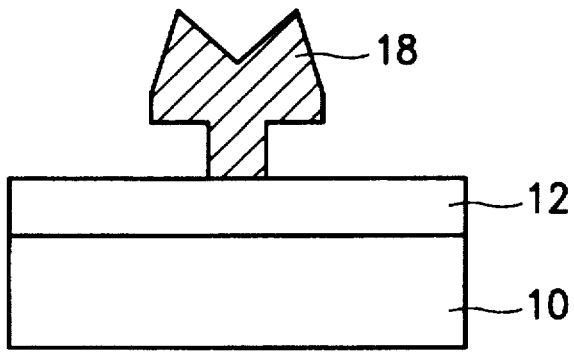
Figure 2A:
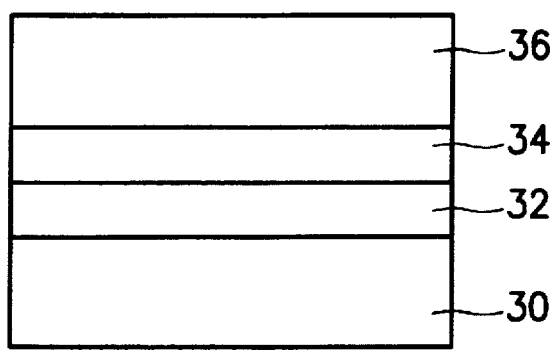
FIGS. 2a to 2h are the diagrams illustrating the fabrication process of a conventional T-gate utilizing a tri-layer photoresist.
Figure 2B:
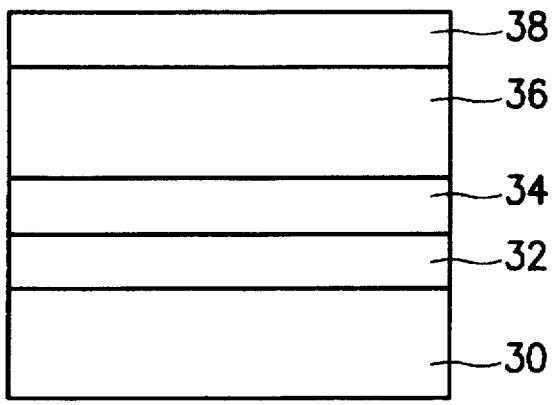
Figure 2C:
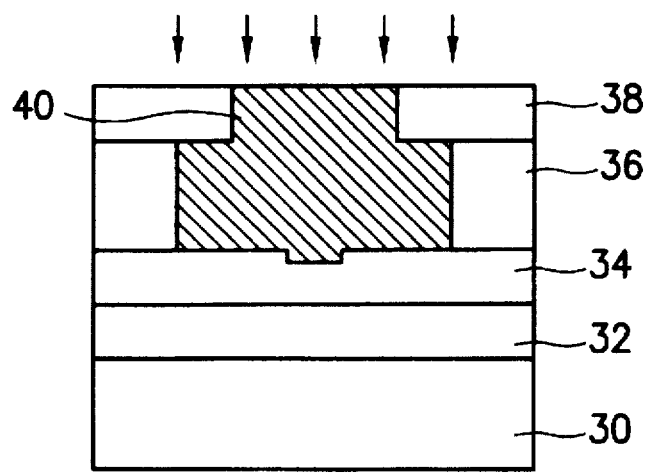
Figure 2D:
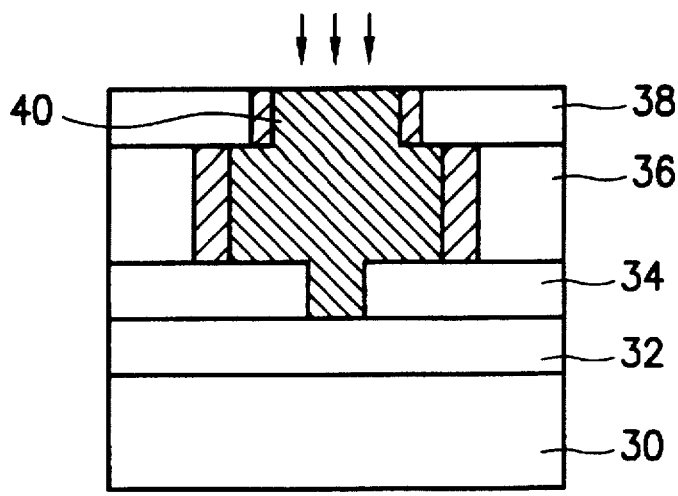
Figure 2E:
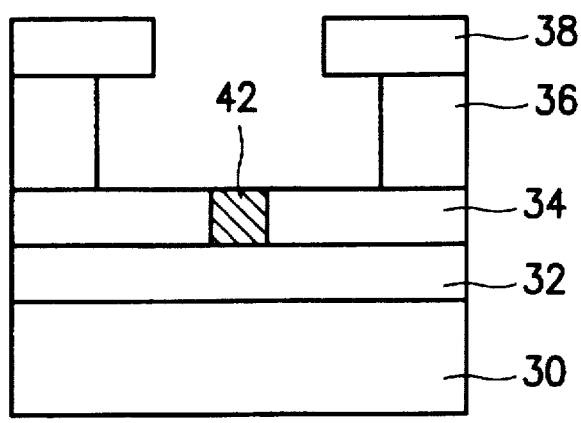
Figure 2F:
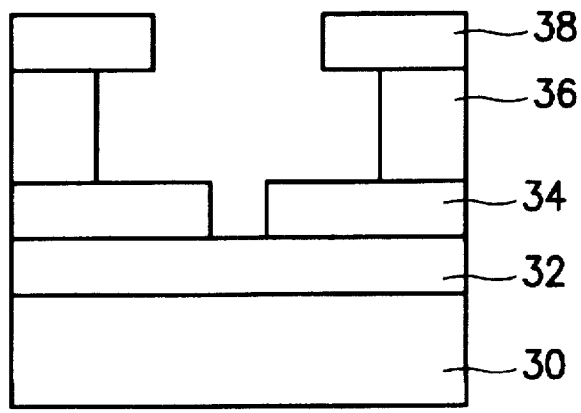
Figure 2G:
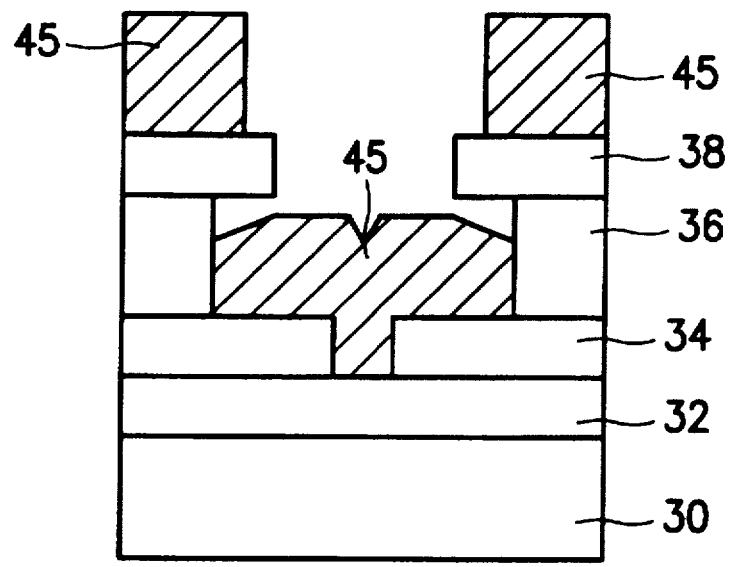
Figure 2H:
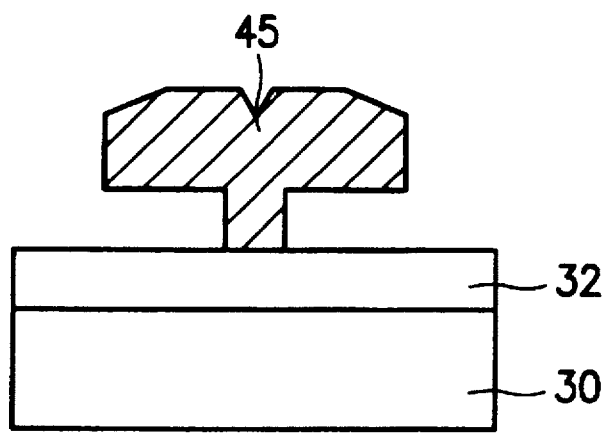
Figure 3A:
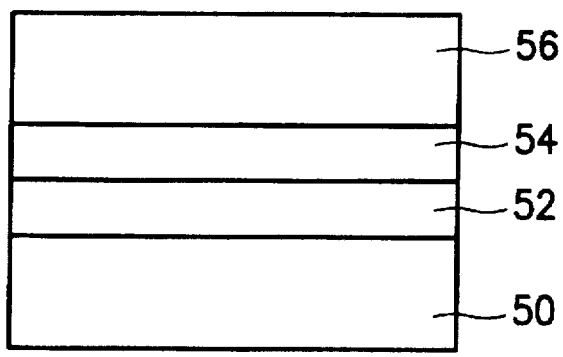
FIGS. 3a to 3f are the diagrams illustrating the fabrication process of a submicron T-shaped gate according to the present invention.
Figure 3B:
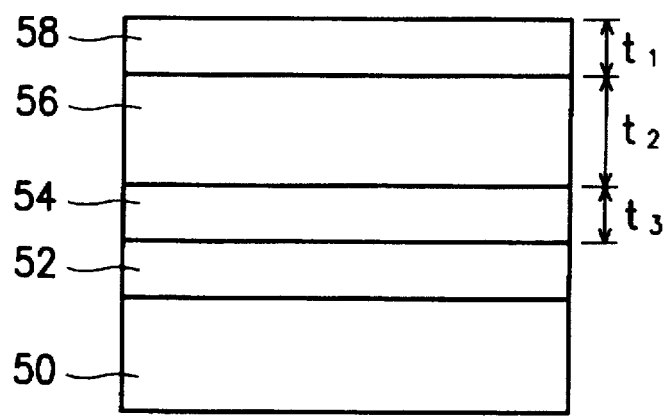
Figure 3C:
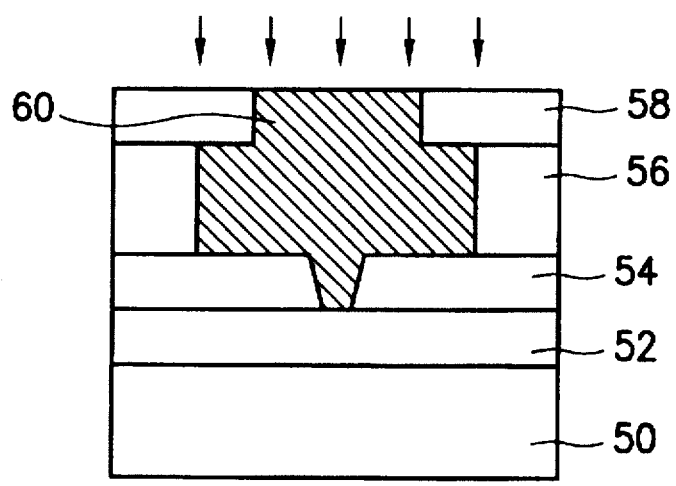
Figure 3D:
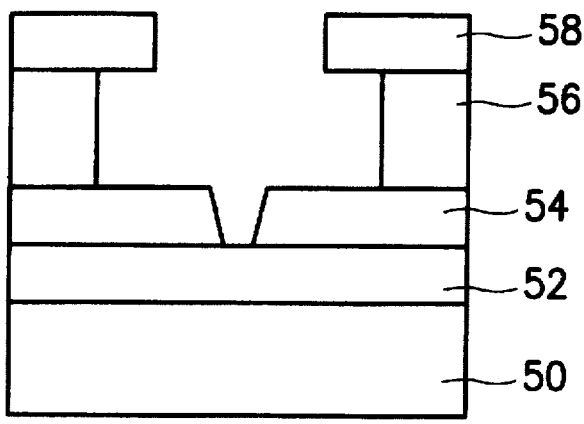
Figure 3E:
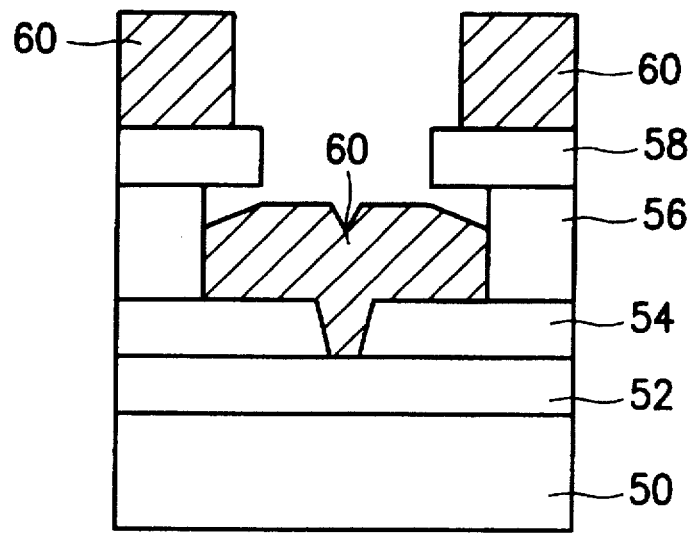
Figure 3F:
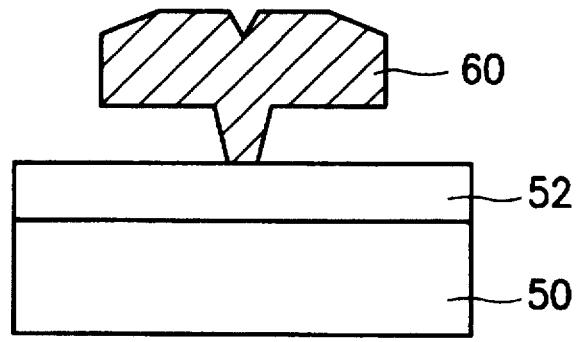
Figure 4A:
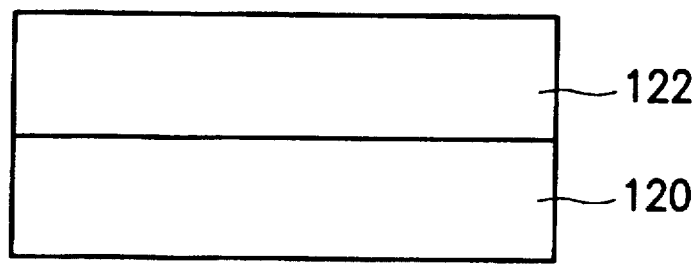
FIGS. 4a to 4e are the diagrams illustrating the fabrication process of a GaAs field-effect transistor by utilizing the present invention.
Figure 4B:
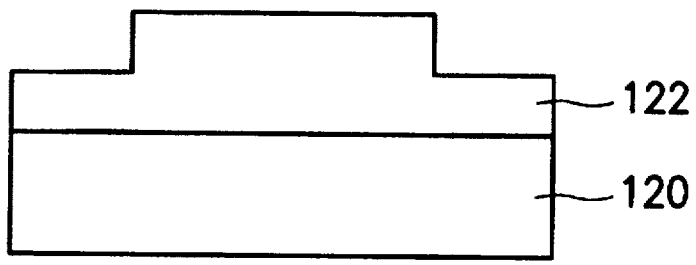
Figure 4C:
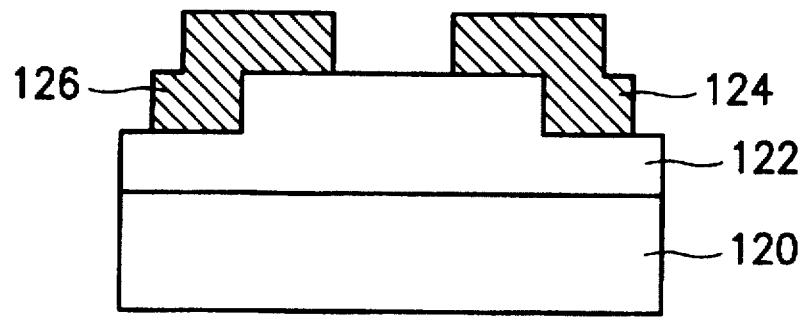
Figure 4D:
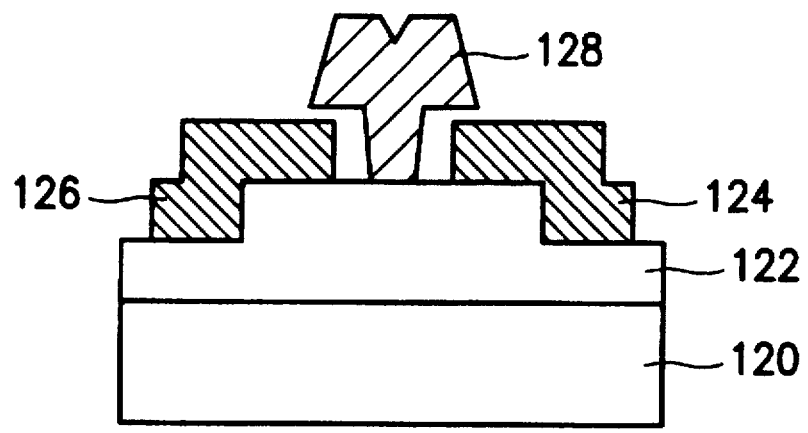
Figure 4E:
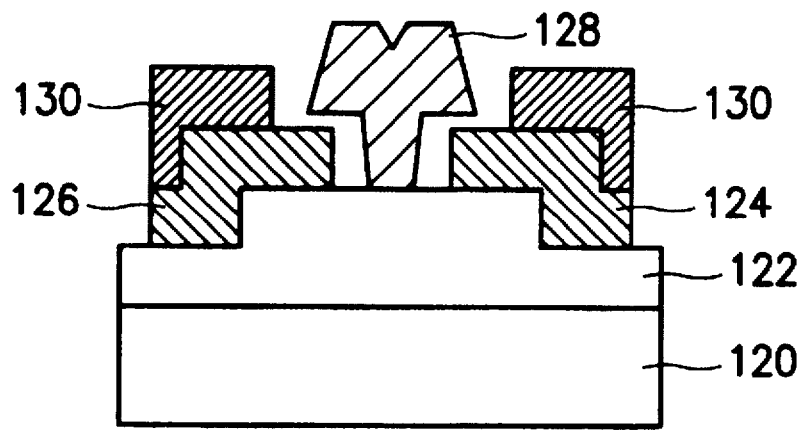

Referring to FIGS. 3a to 3f, the fabrication process of the submicron T-shaped gate of the present invention includes the steps of: (1) as shown in FIG. 3a, growing the epitaxial layers 52 on a GaAs or InP substrate (wafer) 50, forming the first photoresist layer 54 on the epitaxial layer 52 and prebaking the wafer for about 20 minutes, thereafter forming the second photoresist layer 56 on the first photoresist layer 54 and prebaking of the wafer for about 20 minutes; (2) referring to FIG. 3b, forming the third photoresist layer 58 and prebaking of the wafer for about 20 minutes; (3) referring to FIG. 3c, using the electron beam lithography system to expose the three photoresist layers and forming the exposed regions 60 in the three photoresist layers, wherein the accelerating voltage is 25 KV and the e-beam dose is 200 to 400 µC/cm$^2$; (4) referring to FIG. 3d, developing the photoresist layers by using the developer to form an opening; (5)referring to FIG. 3e, evaporating the metal layers 60 on top of the remaining photoresist and the filling of the opening with the metal layers 60; (6) referring to FIG. 3f, lifting off the metal layers 60 that is evaporated on the photoresist by acetone, so that the submicron T-gate is obtained.

The three photoresist layers mentioned above are consisted of two types of photoresists with different electron beam sensitivities and resolutions. The first photoresist layer 54 and the third photoresist layer 58 are a positive photoresist with low electron beam sensitivity, high resolution, and low viscosity, whose weight composition is 80% cyclohexanone and 20% polymethylisopropenyl ketone (PMIPK). The linewidth of opening of the first photoresist layer is about 0.1 to 0.5 µm since the first photoresist layer is at the bottom of the three layers and hence is exposed least. The third photoresist layer is thinner than the first photoresist layer, and has an exposed region larger than the first photoresist layer since it is the uppermost layer. Therefore, the opening formed at the third photoresist layer is larger than the opening at the first photoresist layer after development. Since the electron beam sensitivity of the third layer is smaller than that of the second photoresist layer, the opening at the third photoresist layer is smaller than that of the second photoresist layer. An overhang is thus formed at the third photoresist layer. The overhang may facilitate the liftoff process of the evaporated metal layers so as to raise the fabrication yield. Further, the second layer is a positive photoresist with high electron beam sensitivity and high viscosity, which is consisted of 80% ethylene glycol monoethyl ether acetate and 20% resin. The viscosity of the second photoresist layer is 200 mPa.s, which is larger than the viscosity of the first and the third photoresist layers 56, 58, about 30 mPa.s. The thickness $t_2$ of the second photoresist layer is normally thicker than the thickness $t_3$ of the first photoresist layer, and the thickness $t_3$ of the first photoresist layer is thicker than or equal to the thickness $t_1$, of the third photoresist layer. The linewidth of opening at the first photoresist layer is about 0.1 to 0.5 µm. The ratio of the linewidth of the openings at the second photoresist layer and the first photoresist layer is somewhere between 2:1 and 4:1.

As to the development process, all the three photoresist layers being exposed are developed with a single development step by using a developer to form a T-shaped opening. The developer comprises of methylisobutyl ketone (MIBK), and is diluted by xylene solution in order to control the development rate. This developer can develop all the exposed portions of the three photoresist layers at the same time so as to simplify the development procedures.

The total thickness of the three photoresist layers is about 0.5 to 1.5 µm. The thickness of the evaporated Schottky metal layers is about 3000 to 5000 Angstroms. During the metal liftoff, the wafer evaporated with metal layers is soaked in acetone. By doing so, the evaporated metal layers on top of the photoresist can be lifted off since all three photoresist layers can be dissolved in acetone. Furthermore, a thicker tri-layer photoresist can facilitate the metal liftoff, so that a well-defined submicron T-gate can be obtained and the fabrication yield of the devices using the present invention can be improved.

The fabrication process of the submicron T-shaped gate in this invention is mainly applied to GaAs- and InP-based MESFETs, HEMTs and HFETs.

Referring to FIGS. 4a to 4e, the fabrication process of a GaAs field-effect transistor includes the steps of: (1) referring to FIG. 4a, growing the epitaxial layers 122 on a GaAs substrate 120 by MBE (molecular beam epitaxy) or MOCVD (metal-organic chemical vapor deposition); (2) referring to FIG. 4b, covering the device region of the epitaxial layer 122 with the photoresist layer by using the photolithography technique, then the mesa isolation being done by a wet chemical etch; (3) referring to FIG. 4c, forming the drain 124 and the source 126 on the epitaxial layer 122; (4) referring to FIG. 4d, forming the submicron T-shaped gate 128 on the epitaxial layer 122 by using the fabrication method of the present invention; and (5) referring to FIG. 4e, forming the interconnects 130 on the drain 124 and source 126. A GaAs field-effect transistor is thus obtained.

Figure 5:
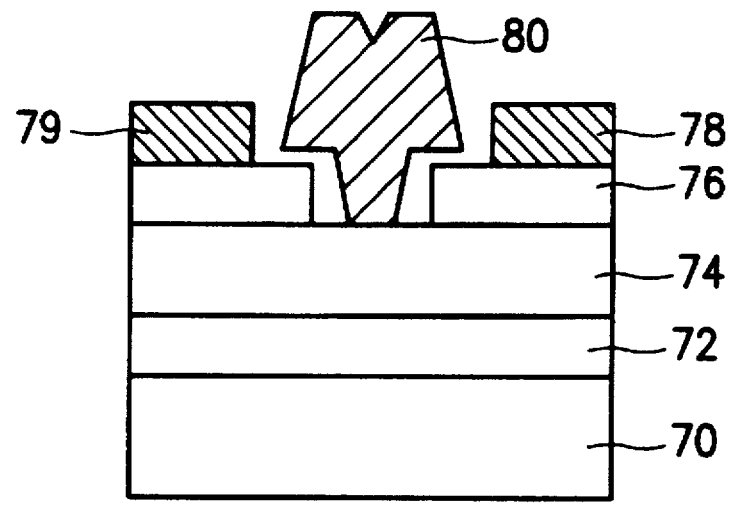
FIG. 5 illustrates the structure of a MESFET (metal-semiconductor field-effect transistor) which includes a submicron T-shaped gate of the present invention.

Referring to FIG. 5, which illustrates the application of a submicron T-shaped gate by implementing this invention for the MESFET, the epitaxial layer formed on the semi-insulating GaAs substrate 70 includes an undoped GaAs buffer layer 72, an n-GaAs channel layer 74, and an n⁺-GaAs contact layer 16. The drain 78 and the source 79 are formed on the n⁺-GaAs layer 76. The submicron T-gate of the present invention is formed on the n-GaAs layer 74, wherein the drain and the source metal layers can be AuGe/Ni/Au and the gate metal can be Ti/Pt/Au.

Figure 6A:
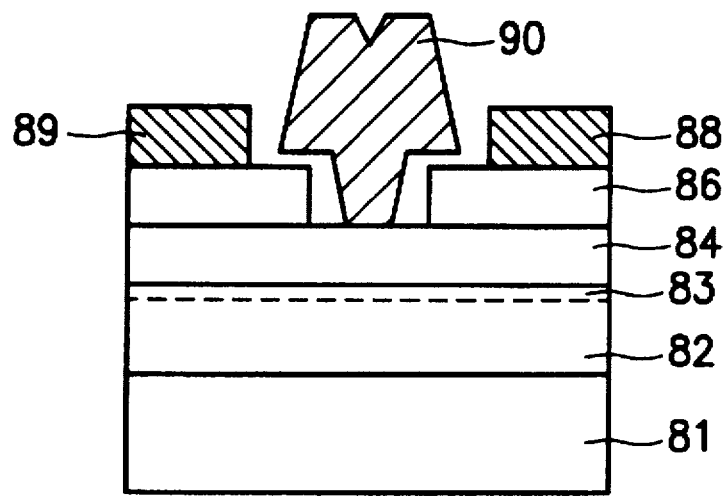
FIGS. 6a to 6d illustrate different structures of HEMTs (high electron mobility transistors) which include submicron T-shaped gates of the present invention.

The embodiments of illustrating applications of the submicron T-shaped gate of the present invention to a AlGaAs/GaAs HEMT are illustrated in FIGS. 6a to 6d. Referring to FIG. 6a, a AlGaAs/GaAs HEMT can be made by sequentially growing an undoped-GaAs layer 82, an n⁺-AlGaAs layer 84, and an n⁺-GaAs contact layer 86, wherein a 2DEG (two-dimensional electron gas) 83 is formed at the undoped-GaAs layer 82/ n⁺-AlGaAs layer 84 interface. Firstly, mesa isolation is done by a wet chemical etch. Then the drain 88 and the source 89 are formed on top of the n⁺-GaAs layer 86. The submicron T-gate 90 is formed on the n⁺-AlGaAs layer 88 by employing the fabrication method of the present invention. Moreover, the source and the drain can be made of AuGe/Ni/Au and the gate can be made of Ti/Pt/Au.

Figure 6B:
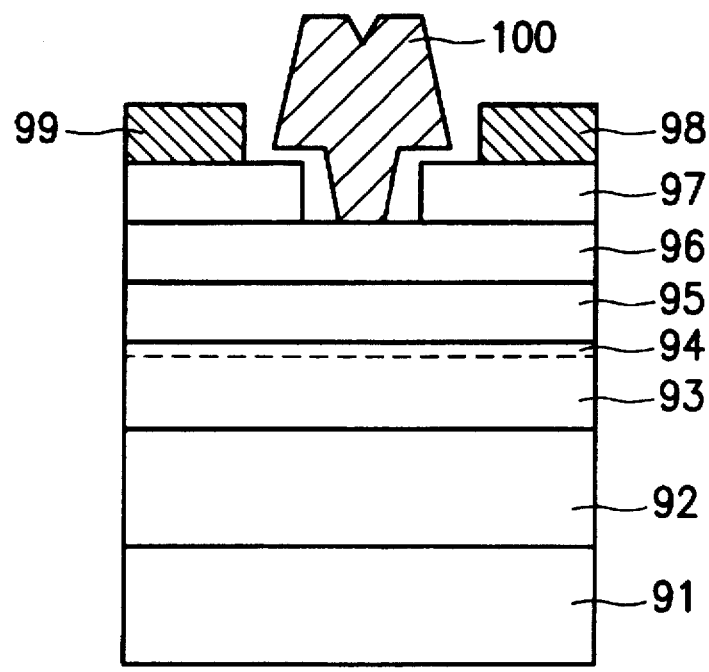

FIG. 6b illustrates the structure of a InAlAs/InGaAs/InP HEMT, which is made by firstly, the growth of the epitaxial layers, that is, an undoped-InAlAs buffer layer 92, an undoped-InGaAs channel layer 93, an n⁺-InAlAs doping layer 95, an undoped-InAlAs barrier layer 96, and an n⁺-InGaAs contact layer 97, on a semi-insulating InP substrate 91. A 2DEG 94 is formed at- the undoped-InGaAs layer 93/n⁺-InAlAs Layer 95 interface.

Figure 6C:
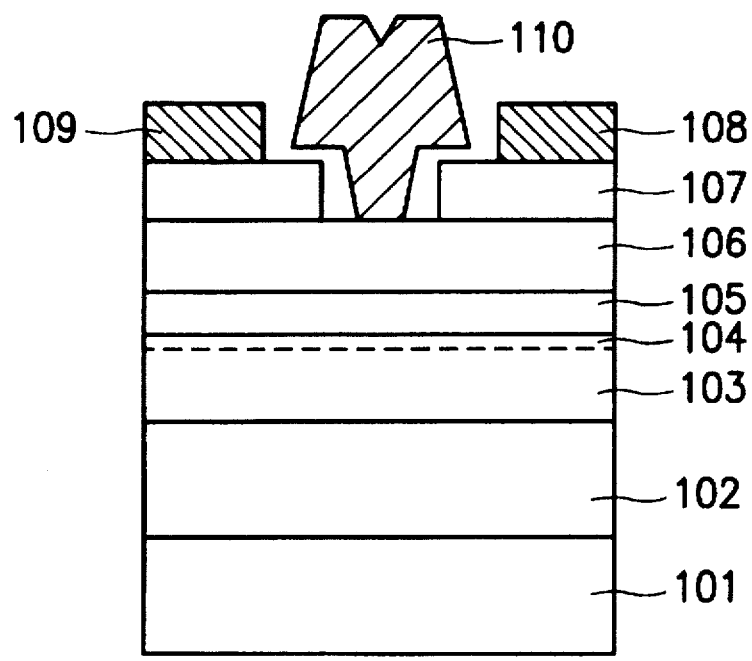

Referring FIG. 6c, a AlGaAs/InGaAs HEMT is illustrated, which has a structure similar to the structure shown in FIG. 6b. The AlGaAs/InGaAs HEMT is made by growing the epitaxial layers, that is, an undoped-GaAs buffer layer 102, an undoped-InGaAs channel layer 103, an undoped-AlGaAs spacer layer 105, and an n⁺-ALGaAs doping layer 106, and an n⁺GaAs contact layer 107, on a semi-insulating GaAs substrate 101. A 2DEG 104 is formed at the undoped-InGaAs channel layer 103/undoped-AlGaAs spacer 105 interface. The drain 108 and source 109 are formed on the n⁺-GaAs layer 107. The submicron T-shaped gate 110 is formed on the n⁺AlGaAs layer 106 by employing the fabrication method of the present invention.

Figure 6D:
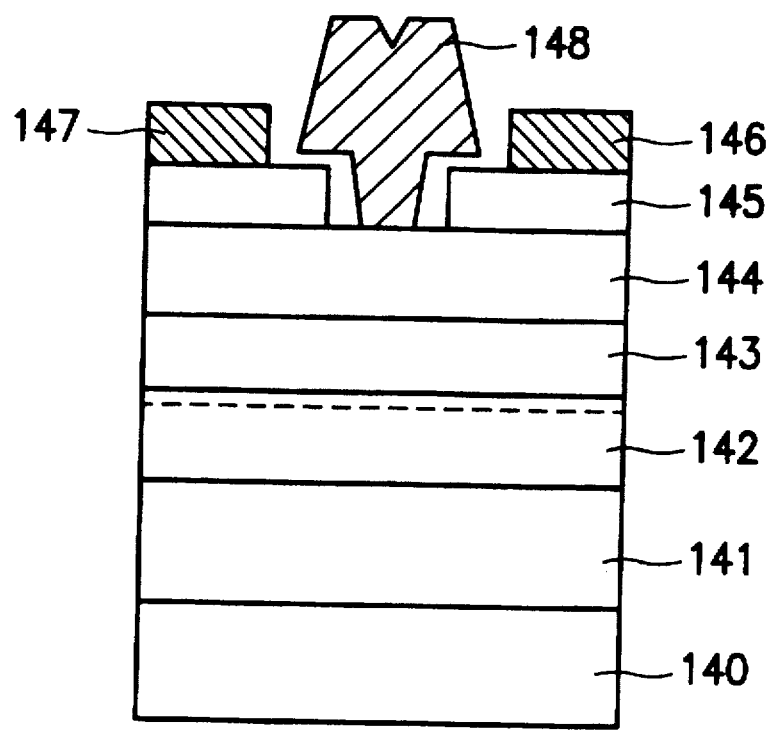

Referring to FIG. 6d, a SiGe/Si HEMT can be made by growing the epitaxial layers which include an undoped-Si buffer layer 141, an undoped-SiGe channel layer 142, a p⁺-Si doping layer 143, an undoped-Si barrier layer 144, and a p⁺-Si contact layer 145, on a high-resistivity p⁻-type Si substrate 140. A two-dimensional hole gas is formed at the undoped-SiGe 142/p⁺-Si 143 interface. The source 146 and drain 147 are respectively formed on the p⁺-Si layer 143. The submicron T-shaped gate 148 is formed on the undoped-Si layer 144 by employing the fabrication method of the present invention.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A method for fabricating a submicron T-shaped gate, which can be applied to high-speed field-effect transistors, comprising the steps of:

(i) growing epitaxial layers on a semiconductor substrate, then sequentially forming a first photoresist layer, a second photoresist layer and a third photoresist layer on the epitaxial layers, wherein the second photoresist layer is thicker than the third photoresist layer, and the third photoresist layer is not thicker than the first photoresist layer, the viscosity of the second photoresist layer is larger than that of the first photoresist layer and the third photoresist layer, and the electron beam sensitivity of the second photoresist layer is larger than that of the first photoresist layer and the third photoresist layer;

(ii) exposing the first photoresist layer, the second photoresist layer and the third photoresist layer by an electron beam lithography system, by a single exposure;

(iii) using a developer to develop exposed positions of the first photoresist layer, the second photoresist layer and the third photoresist layer by a single development step to remove the exposed potions of the tri-layer photoresist and form a T-shaped opening;

(iv) etching and removing a contact layer of the epitaxial layers under the T-shaped opening;

(v) evaporating Schottky metal layers to cover the third photoresist layer and fill the T-shaped opening;

(vi) removing the first photoresist layer, the second photoresist layer, and the third photoresist layer to lift off the metal layers evaporated on the third photoresist layer so that the submicron T-shaped gate is obtained.

2. The method as claimed in claim 1, further comprising a step of: prebaking photoresist layers after spinning coating each of the first photoresist layer, the second photoresist layer, and the third photoresist layer.

3. The method as claimed in claim 1, wherein, the first photoresist layer and the third photoresist layer comprise 80% cyclohexanone and 20% polymethylisopropenyl ketone.

4. The method as claimed in claim 1, wherein, the second photoresist layer comprises 80% ethylene glycol monoethyl ether acetate and 20% resin.

5. The method as claimed in claim 1, wherein, the semiconductor substrate is GaAs.

6. The method as claimed in claim 1, wherein, the semiconductor substrate is InP.

7. The method as claimed in claim 1, wherein, the total thickness of the first photoresist layer, the second photoresist layer, and the third photoresist layer is about 0.5 to 1.5 μm.

8. The method as claimed in claim 1, wherein, the linewidth of opening at the first photoresist layer is about 0.1 to 0.5 μm.

9. The method as claimed in claim 1, wherein, the Schottky metal layers can be Ti/Pt/Au.

10. The method as claimed in claim 1, wherein, the developer is methylisobutyl ketone, and is diluted by xylene solution.

11. The method as claimed in claim 1, wherein, the Schottky metal layers have a total thickness of about 3000 to 5000 Angstroms.

12. The method as claimed in claim 3, wherein, the viscosity of the first photoresist layer and the third photoresist layer can be varied from 30 to 50 mPa.s, depending on the weight composition ratio of cyclohexanone and polymethylisopropenyl ketone.

13. The method as claimed in claim 4, wherein, the viscosity of the second photoresist layer can be varied from 150 to 200 mPa.s, depending on the weight composition ratio of ethylene glycol monoethyl ether acetate and resin.

14. The method as claimed in claim 7, wherein, the aspect ratio of the linewidths of openings of the second photoresist layer and the first photoresist layer is somewhere between 2:1 and 4:1.

15. The method as claimed in claim 1, wherein, the structure of the epitaxial layers is a structure of metal-semiconductor field-effect transistor.

16. The method as claimed in claim 1, wherein, the structure of the epitaxial layers is a structure of high electron mobility field-effect transistor.

17. The method as claimed in claim 1, wherein, the structure of the epitaxial layers is a structure of heterostructure field-effect transistor.

18. The method as claimed in claim 1, wherein, the semiconductor substrate is Si.

* * * * *